(12) United States Patent
Chiu et al.

(10) Patent No.: US 10,533,252 B2
(45) Date of Patent: Jan. 14, 2020

(54) SHOWERHEAD, SEMICONDCUTOR PROCESSING APPARATUS HAVING THE SAME AND SEMICONDUCTOR PROCESS

(71) Applicant: Taiwan Semiconductor Manufacturing Co., Ltd., Hsinchu (TW)

(72) Inventors: Chih-Chiang Chiu, Changhua County (TW); Ding-I Liu, Hsinchu (TW); Chin-Feng Lin, Hsinchu County (TW); Po-Hsiung Leu, Taoyuan (TW)

(73) Assignee: Taiwan Semiconductor Manufacturing Co., Ltd., Hsinchu (TW)

( * ) Notice: Subject to any disclaimer, the term of this patent is extended or adjusted under 35 U.S.C. 154(b) by 416 days.

(21) Appl. No.: 15/088,064

(22) Filed: Mar. 31, 2016

(65) Prior Publication Data

US 2017/0283948 A1  Oct. 5, 2017

(51) Int. Cl.
| | |
|---|---|
| *C23C 16/50* | (2006.01) |
| *C23C 16/455* | (2006.01) |
| *H01J 37/32* | (2006.01) |
| *C23C 16/505* | (2006.01) |

(52) U.S. Cl.
CPC .. *C23C 16/45565* (2013.01); *C23C 16/45536* (2013.01); *C23C 16/45544* (2013.01); *C23C 16/505* (2013.01); *H01J 37/3244* (2013.01); *H01J 37/32082* (2013.01); *H01J 37/32357* (2013.01); *H01J 37/32449* (2013.01); *H01J 37/32568* (2013.01); *H01J 2237/3321* (2013.01)

(58) Field of Classification Search
CPC ........ C23C 16/45565; C23C 16/45544; C23C 16/45536; C23C 16/505; H01J 37/32568; H01J 37/32449; H01J 37/32357; H01J 37/3244; H01J 37/32082; H01J 2237/3321
USPC ..... 118/723 E, 723 ER; 156/345.43, 345.44, 156/345.45
See application file for complete search history.

(56) References Cited

U.S. PATENT DOCUMENTS

| | | | | |
|---|---|---|---|---|
| 5,380,396 | A | * 1/1995 | Shikida | ................. F04B 43/043 |
| | | | | 118/728 |
| 6,162,323 | A | * 12/2000 | Koshimizu | ......... H01J 37/3244 |
| | | | | 156/345.26 |
| 6,173,673 | B1 | * 1/2001 | Golovato | .......... H01L 21/67069 |
| | | | | 118/723 E |

(Continued)

*Primary Examiner* — Rudy Zervigon
(74) *Attorney, Agent, or Firm* — JCIPRNET

(57) ABSTRACT

A showerhead is configured to be mounted inside a processing chamber and provide a processing gas onto a semiconductor wafer inside the processing chamber. The showerhead includes a supply plenum, a faceplate, and an electrode plate assembly. The faceplate is disposed at a side of the supply plenum. The electrode plate assembly is disposed between a gas source and the supply plenum. The electrode plate assembly includes a first plate having a unitary construction and having a plurality of first gas holes, and a second plate having a unitary construction and having a plurality of second gas holes. The second plate is located between the first plate and the supply plenum and separated from the first plate. The plurality of second gas holes are partially overlapped but misaligned with the plurality of first gas holes. A semiconductor apparatus having the same and a semiconductor process are also provided.

18 Claims, 4 Drawing Sheets

(56) References Cited

U.S. PATENT DOCUMENTS

| | | | | |
|---|---|---|---|---|
| 6,830,007 B2 * | 12/2004 | Matsuki | ............ | H01J 37/32357 118/723 E |
| 2002/0129902 A1 * | 9/2002 | Babayan | ............... | C23C 16/402 156/345.45 |
| 2003/0010452 A1 * | 1/2003 | Park | .................. | C23C 16/45565 156/345.33 |
| 2004/0082251 A1 * | 4/2004 | Bach | ................. | C23C 16/45563 445/60 |
| 2006/0102286 A1 * | 5/2006 | Kim | ...................... | C23C 16/452 156/345.35 |
| 2009/0004884 A1 * | 1/2009 | Nagamine | ............... | H01L 43/08 438/771 |

* cited by examiner

SHOWERHEAD, SEMICONDCUTOR PROCESSING APPARATUS HAVING THE SAME AND SEMICONDUCTOR PROCESS

BACKGROUND

During some semiconductor processes, substrates or wafers are processed by deposition. For example, in plasma-enhanced chemical vapor deposition (PECVD) or plasma-enhanced atomic layer deposition (PEALD), a process gas is admitted into a reaction chamber held at a reduced pressure, and oscillatory electric energy at a radio frequency (RF) is applied to the chamber to excite the gas into a plasma. The gas reacts with the surface of a substrate or wafer exposed to the plasma to form a film on the wafer of a composition derived from that of the process gas. The film formed on the wafer or the substrate is desired to have good uniformity. Accordingly, the semiconductor apparatus for the semiconductor process must be designed to ensure good uniformity for the film deposited on the wafer or the substrate.

BRIEF DESCRIPTION OF THE DRAWINGS

Aspects of the present disclosure are best understood from the following detailed description when read with the accompanying figures. It is noted that, in accordance with the standard practice in the industry, various features are not drawn to scale. In fact, the dimensions of the various features may be arbitrarily increased or reduced for clarity of discussion.

DETAILED DESCRIPTION

Figure 1:
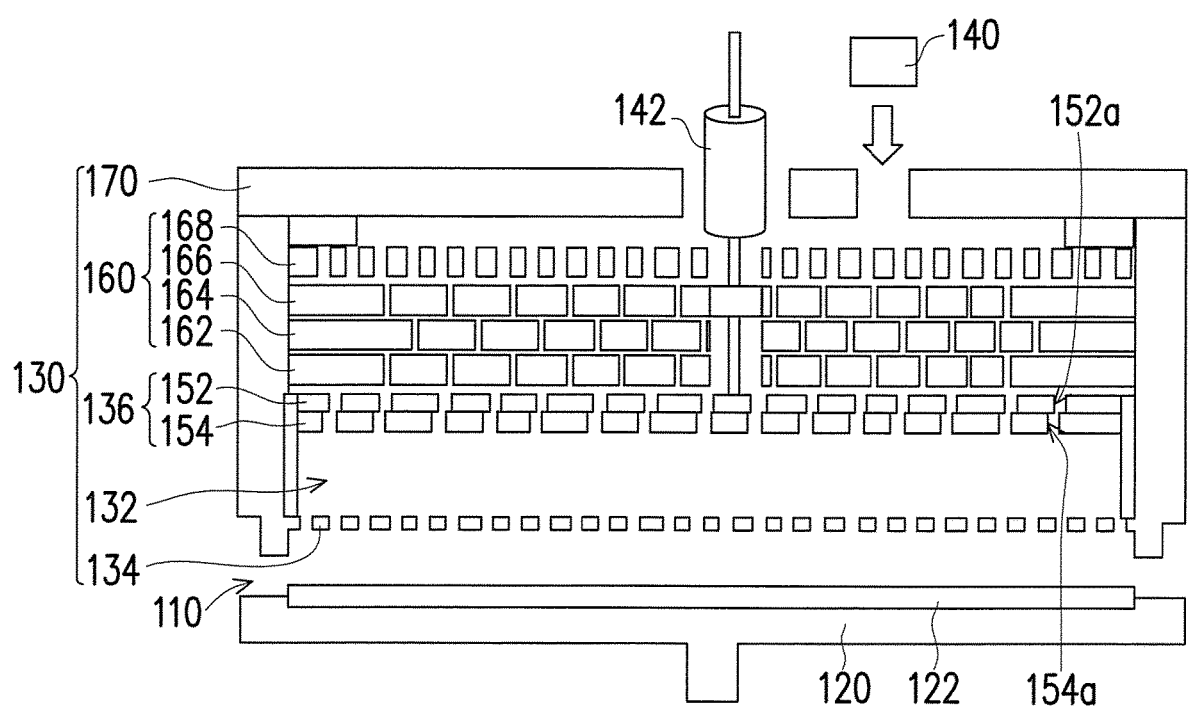
FIG. 1 is a schematic cross sectional view of a semiconductor processing apparatus according to an embodiment of the present disclosure.

The following disclosure provides many different embodiments, or examples, for implementing different features of the provided subject matter. Specific examples of components and arrangements are described below to simplify the present disclosure. These are, of course, merely examples and are not intended to be limiting. For example, the formation of a first feature over or on a second feature in the description that follows may include embodiments in which the first and second features are formed in direct contact, and may also include embodiments in which additional features may be formed between the first and second features, such that the first and second features may not be in direct contact. In addition, the present disclosure may repeat reference numerals and/or letters in the various examples. This repetition is for the purpose of simplicity and clarity and does not in itself dictate a relationship between the various embodiments and/or configurations discussed.

Further, spatially relative terms, such as "beneath," "below," "lower," "above," "upper" and the like, may be used herein for ease of description to describe one element or feature's relationship to another element(s) or feature(s) as illustrated in the figures. The spatially relative terms are intended to encompass different orientations of the device in use or operation in addition to the orientation depicted in the figures. The apparatus may be otherwise oriented (rotated 90 degrees or at other orientations) and the spatially relative descriptors used herein may likewise be interpreted accordingly.

FIG. 1 is a schematic cross sectional view of a semiconductor processing apparatus according to an embodiment of the present disclosure. Referring to FIG. 1, a semiconductor processing apparatus 100 includes a processing chamber 110, a substrate support 120, and a showerhead 130. The substrate support 120 is disposed inside the processing chamber 110 and is configured for supporting a semiconductor wafer 122. The showerhead 130 is configured to be mounted on the processing chamber 110 and provides a processing gas onto the semiconductor wafer 122 inside the processing chamber 110. The showerhead 130 includes a supply plenum 132, a faceplate 134, and an electrode plate assembly 136. The faceplate 134 is disposed at a side of the supply plenum 132 for providing the processing gas flowing from the supply plenum 132 to the semiconductor wafer 112. The electrode plate assembly 136 is disposed between a gas source 140 and the supply plenum 132 for providing the processing gas from the gas source 140 to the supply plenum 132. The electrode plate assembly 136 includes a first plate 152 and a second plate 154. The first plate 152 has a unitary construction and includes a plurality of first gas holes 152a. The second plate 154 has a unitary construction and includes a plurality of second gas holes 154a. The second plate 154 is located between the first plate 152 and the supply plenum 132 and is separated from the first plate 152. The second gas holes 154a are partially overlapped but misaligned with the first gas holes 152a.

In some embodiments, the faceplate 134 and the substrate support 120 defines the processing chamber 110 for the semiconductor wafer 122 to be disposed in. That is to say, the semiconductor wafer 122 is disposed in the processing chamber 110 defined by the faceplate 134 and the substrate support 120 to be processed in the processing chamber 110. Thus, the processing chamber 110 is a region or gas chamber for the processing gas to flow into and process the semiconductor wafer 122.

In some embodiments, the first gas holes 152a are arranged in the same pattern as the second gas holes 154a. That is to say, the pattern of the first gas holes 152a on the first plate 152 is the same as the pattern of the second gas holes 154a on the second plate 154. Furthermore, each of the first gas holes 152a and each of the second gas holes 154a are the same size. That is to say, the first plate 152 and the second plate 154 are identical to each other, and the first gas holes 152a and the second gas holes 154a of the respective first plate 152 and second plate 154 are also identical to each other and positioned identically. Thus, the first plate 152 and the second plate 154 are shifted with respect to each other so that the first gas holes 152a and the second gas holes 154a are partially overlapped but misaligned. However, the disclosure is not limited thereto. The first gas holes 152a and the second gas holes 154a do not have to be arranged in the same manner and do not have to have the same size in order to be partially overlapped and misaligned with each other. In addition, the first plate 152 and the second plate 154 do not have to be identical to each other, but may be designed differently according to user requirements. The user may design the first plate 152 and the second plate 154 as well as the first gas holes 152a and the second gas holes 154a so that they are partially overlapped but misaligned without having them all be identical to each other.

In some embodiments, the showerhead 130 further includes a gas distribution manifold assembly 160 disposed between the gas source 140 and the electrode plate assembly 136 for supplying the processing gas to the first gas holes 152a of the first plate 154. That is to say, the processing gas is supplied from the gas source 140 to the gas distribution manifold assembly 160. The processing gas then flows through the gas distribution manifold assembly 160 to the first plate 154 of the electrode plate assembly 136. The processing gas then flows through the first gas holes 152a of the first plate 152 to the second gas holes 154a partially overlapped with the first gas holes 152a, and flows out of the second gas holes 154a of the second plate 154 to the supply plenum 132.

In some embodiments, the gas distribution manifold assembly 160 includes a first gas plate 162, a second gas plate 164, a third gas plate 166, and a top grounding plate 168. In some embodiments, the material of the first gas plate 162, the second gas plate 164, and the third gas plate 166 is ceramic. However, the disclosure is not limited thereto. The material of the first gas plate 162, the second gas plate 164, and the third gas plate 166 may be adjusted according to the user. In some embodiments, the showerhead 130 includes a top plate 170. The processing gas from the gas source 140 is supplied to the showerhead 130 from at least one opening in the top plate 170 (shown by the arrow from the gas source 140). As the processing gas flows into the at least one opening of the top plate 170, the processing gas flows into the gas distribution manifold assembly 160. Each of the first gas plate 162, the second gas plate 164, the third gas plate 166, and the top grounding plate 168 includes a plurality of openings. The openings may be aligned or misaligned with each other, and the configuration of the positions each of the first gas plate 162, the second gas plate 164, the third gas plate 166, and the top grounding plate 168 with respect to each other may be adjusted according to user requirements. In addition, the configuration of the positions, shapes, and sizes of the openings of each of the first gas plate 162, the second gas plate 164, the third gas plate 166, and the top grounding plate 168 may also be adjusted according to user requirements. In some embodiments, the processing gas flows into the gas distribution manifold assembly 160 and flows through the openings of the top ground plate 168, the first gas plate 162, the second gas plate 164, and the third gas plate 166. Then the processing gas exits the gas distribution manifold assembly 160 to flow to the electrode plate assembly 136. The order of the first gas plate 162, the second gas plate 164, and the third gas plate 166 is not limited to the order shown in FIG. 1. The first gas plate 162, the second gas plate 164, and the third gas plate 166 may be arranged in any order desired by the user within the gas distribution manifold assembly 160.

In some embodiments, at least one of the first plate 152 and the second plate 154 is powered, and the faceplate 134 is grounded to ionize the processing gas and form ionized gas plasma in the supply plenum 132. In some embodiments, the first plate 152 is connected with a radio frequency (RF) power 142. However, in other embodiments, the second plate 154 is connected with the radio frequency (RF) power 142. That is to say, the RF power 142 is connected to the electrode plate assembly 136 of the showerhead 130, and acts against the grounded faceplate 134 of the showerhead 130 to form the ionized plasma of the processing gas and flow to the supply plenum 132. Depending on the design, the first plate 152 may be disposed on the second plate 154. In this case, the first plate 152 is connected with the RF power 142. Similarly, if the second plate 154 is disposed on the first plate 152, the second plate 154 is connected with the RF power 142. The disclosure does not limit either the first plate 152 or the second plate 154 being connected to the RF power 142 as long as the RF power 142 is connected to the electrode plate assembly 136 to power one of the first plate 152 or the second plate 154. In some embodiments, both the first plate 152 and the second plate 154 may be connected to the RF power 142, and both the first plate 152 and the second plate 154 are powered by the RF power 142.

In some embodiments, the processing gas supplied from the gas source 140 may be, for example, silicon nitride, silicon dioxide, nitrogen, hydrogen or any suitable process gas in a deposition process. The deposition process may be a chemical vapor or an atomic layer deposition process or any suitable deposition process for processing the semiconductor wafer 122. However, the disclosure is not limited thereto. The processing gas may be any suitable processing gas for any suitable semiconductor process desired by the user. In addition, the processing gas may be provided with ionized gas plasma so as to be excited into plasma. In addition, the semiconductor processing apparatus 100 is not limited to only be supplied by processing gas. The semiconductor processing apparatus 100 may also be supplied with, for example, a cleaning gas, to cleaning the showerhead 130 and the processing chamber 110 when desired by the user. The semiconductor processing apparatus 100 may also be supplied with, for example, a purge gas, to undergo a purge process when desired by the user. The disclosure does not limit the type of gas that is supplied to the semiconductor processing apparatus 100.

In some embodiments, as described above, the processing gas flows from the gas distribution manifold assembly 160 to the electrode plate assembly 136. Since the electrode plate assembly 136 is connected to the RF power 142 and the faceplate 134 is grounded, the processing gas is ionized to form the ionized plasma. That is to say, the RF power 142 connected to the electrode plate assembly 136 and the grounded faceplate 134 creates an RF (radio frequency) field. The RF field created by the biased electrode plate assembly 136 excites the processing gas so that the plasma is created and flowed in the supply plenum 132. In FIG. 1, the first plate 152 is connected to the RF power 142. However, as described above, the second plate 154 or both the second plate 154 and the first plate 152 may be connected to the RF power 142.

In some embodiments, the substrate support 120 is a rotating susceptor. That is to say, the substrate support 120 rotates and supports the semiconductor wafer 122. The substrate support 120 with the semiconductor wafer 122 rotates so as to create a downward pumping action in the direction of the semiconductor wafer 122. The downward pumping action of the rotating susceptor 120 or substrate support 120 draws the plasma from the supply plenum 132 flowing out of the openings of the faceplate 134 toward the surface of the semiconductor wafer 122. At the surface of the semiconductor wafer 122, the plasma flows radially outward from the center of the semiconductor wafer 122 in a substantially uniform laminar flow pattern to form a film layer being deposited upon the surface of the semiconductor wafer 122 in the processing chamber 110.

Figure 2:
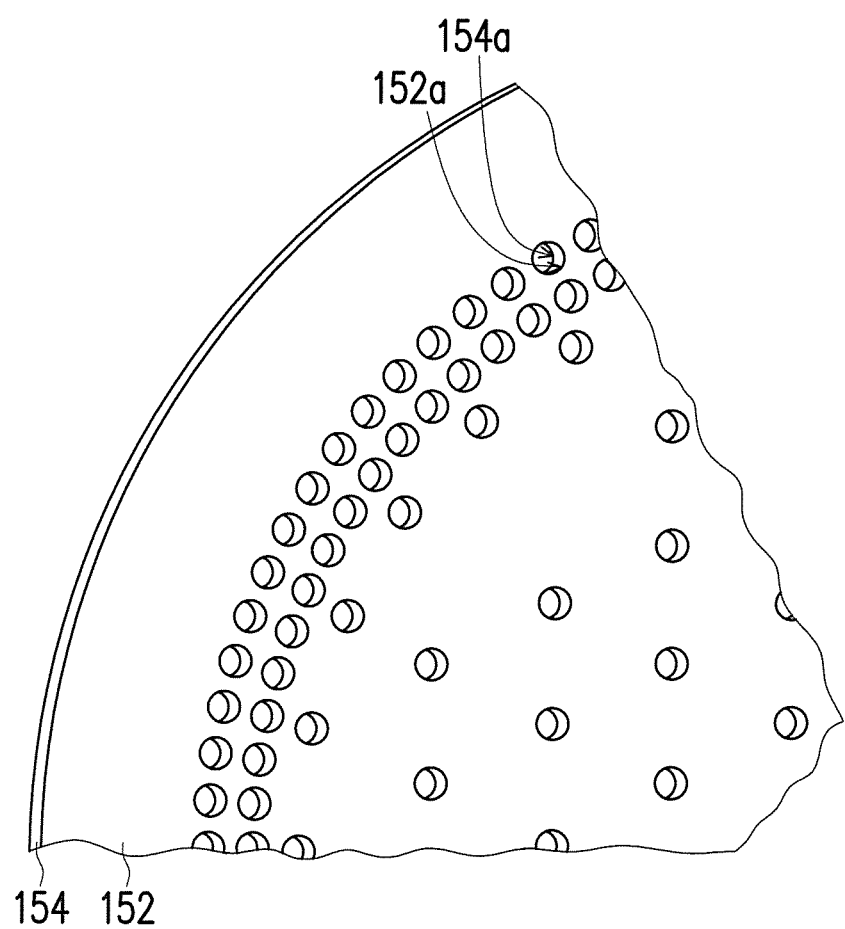
FIG. 2 is a schematic partial top view of an electrode plate assembly of the semiconductor processing apparatus of FIG. 1.

In some embodiments, the electrode plate assembly 136 is a tunable electrode plate assembly 136. As seen in FIG. 2, FIG. 2 is a schematic partial top view of an electrode plate assembly of the semiconductor processing apparatus of FIG. 1. In some embodiments, the first plate 152 has a unitary construction. That is to say, the first plate 152 is made as one piece. In addition, the second plate 154 has a unitary construction. Similarly, the second plate 154 is also made as one piece. Each of the first plate 152 and the second plate 154 are made as one piece, and has a unitary construction. The second plate 154 is located between the first plate 152 and the supply plenum 132 and is separated from the first plate 152. This way, the first plate 152 and the second plate 154 may be shifted with respect to each other as seen in FIG. 1 and FIG. 2. As a result, the first gas holes 152a and the second gas holes 154a are partially overlapped but misaligned with each other. In some embodiments, as seen in FIG. 1 and FIG. 2, for example, the first plate 152 is on the second plate 154 so that the first gas holes 152a are above the second gas holes 154a. In order to misalign the first gas holes 152a and the second gas holes 154a, the first plate 152 and the second plate 154 are shifted with respect to each other so that they are misaligned. Since the first gas holes 152a and the second gas holes 154a are partially overlapped, the processing gas may still flow through to the supply plenum 132. Since the first gas holes 152a and the second gas holes 154a are misaligned with each other, the density of the plasma that is formed from the RF field may be higher and the flow velocity of the plasma may be lower. The electrode plate assembly 136 is tunable because the first plate 152 and the second plate 154 may be shifted more or less with reference to shift shown in FIG. 2. That is to say, the shift between the first plate 152 and the second plate 154 shown in FIG. 2 is merely exemplary, and the user may shift the first plate 152 and the second plate 154 more or less with respect to each other to obtain the desired results. For example, if the user may adjust the plasma density or flow velocity of the plasma or processing gas, the shift between the first plate 152 and the second plate 154 may be tuned or adjusted. Thus, the electrode plate assembly 136 is tunable by shifting the first plate 152 and the second plate 154 with respect to each other. By shifting the first plate 152 and the second plate 154 with respect to each other, how much of the first gas holes 152a are above the second gas holes 154a are overlapped and misaligned is tuned and adjusted as well, according to what the user desires.

In some embodiments, as described above, the electrode plate assembly 136 of the showerhead 130 is tunable because the first plate 152 and the second plate 154 may be shifted with respect to each other. As the processing gas flows through the gas manifold distribution assembly 160 and then through the tunable electrode plate assembly 136, the processing gas that is excited into plasma flows into the supply plenum 132. The properties of the plasma may be determined by tuning the electrode plate assembly 136. Then the plasma flows out of the faceplate 134 and onto the semiconductor wafer 122 in the processing chamber 110. By adjusting the properties of the plasma, the thin film deposited onto the semiconductor wafer 122 in the processing chamber 110 may have better uniformity.

Figure 3:
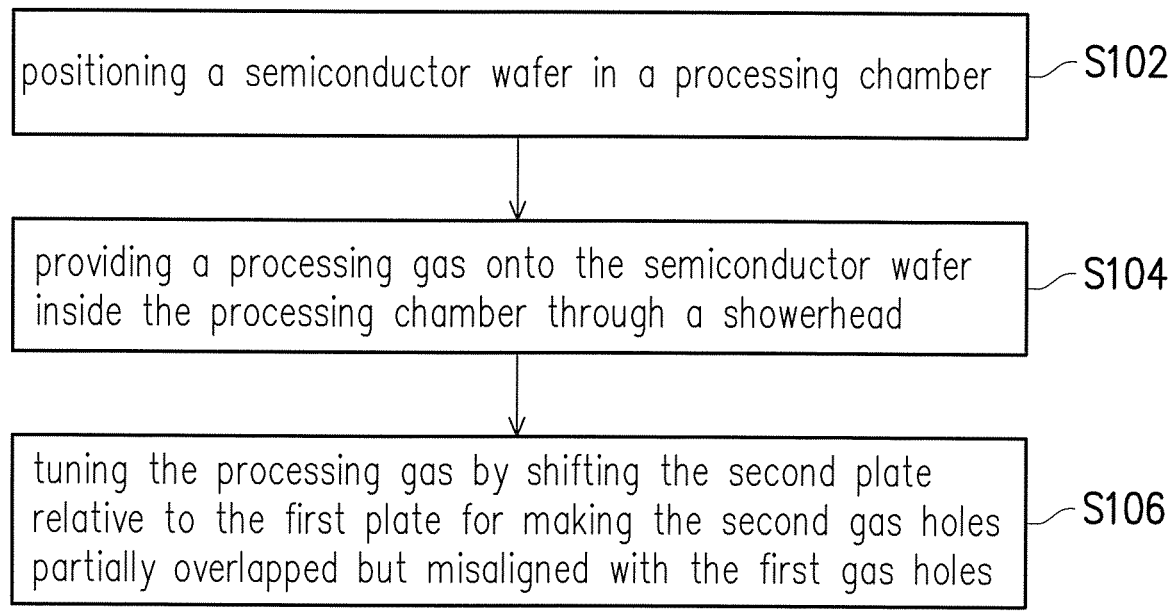
FIG. 3 is a flow chart illustrating a semiconductor process according to an embodiment of the present disclosure.

FIG. 3 is a flow chart illustrating a semiconductor process according to an embodiment of the present disclosure. The semiconductor process may be performed by the semiconductor processing apparatus 100 described in FIG. 1 and FIG. 2. In the semiconductor process, the process includes positioning the semiconductor wafer 122 in the processing chamber 110 (step S102). The semiconductor wafer 122 is positioned on the substrate support 120, which may also be a rotating susceptor. The semiconductor process further includes providing the processing gas through the showerhead 130 onto the semiconductor wafer 122 inside the processing chamber 110 (step S104). That is to say, the showerhead 130 provides the processing gas onto the semiconductor wafer 122 in the processing chamber 110. The description of the showerhead 130 may be referred to in the above embodiments, and will not be repeated herein. The semiconductor process further includes tuning the processing gas by shifting the second plate 154 relative to the first plate 152 for making the second gas holes 154a partially overlapped but misaligned with the first gas holes 152a (step S106). In the semiconductor process, the processing gas is provided with ionized gas plasma. That is to say, the processing gas may have ionized gas plasma so as to be excited into plasma. In some embodiments, at least one of the first plate 152 and the second plate 154 is powered, and the faceplate 134 is grounded to ionize the processing gas and form the ionized gas plasma in the supply plenum 132. The steps S102, S104, and S106 are not limited to being performed in the particular order described above. The steps S102, S104, and S106 may be performed in any order and some may be performed at the same time if desired or required by the user.

Figure 4:
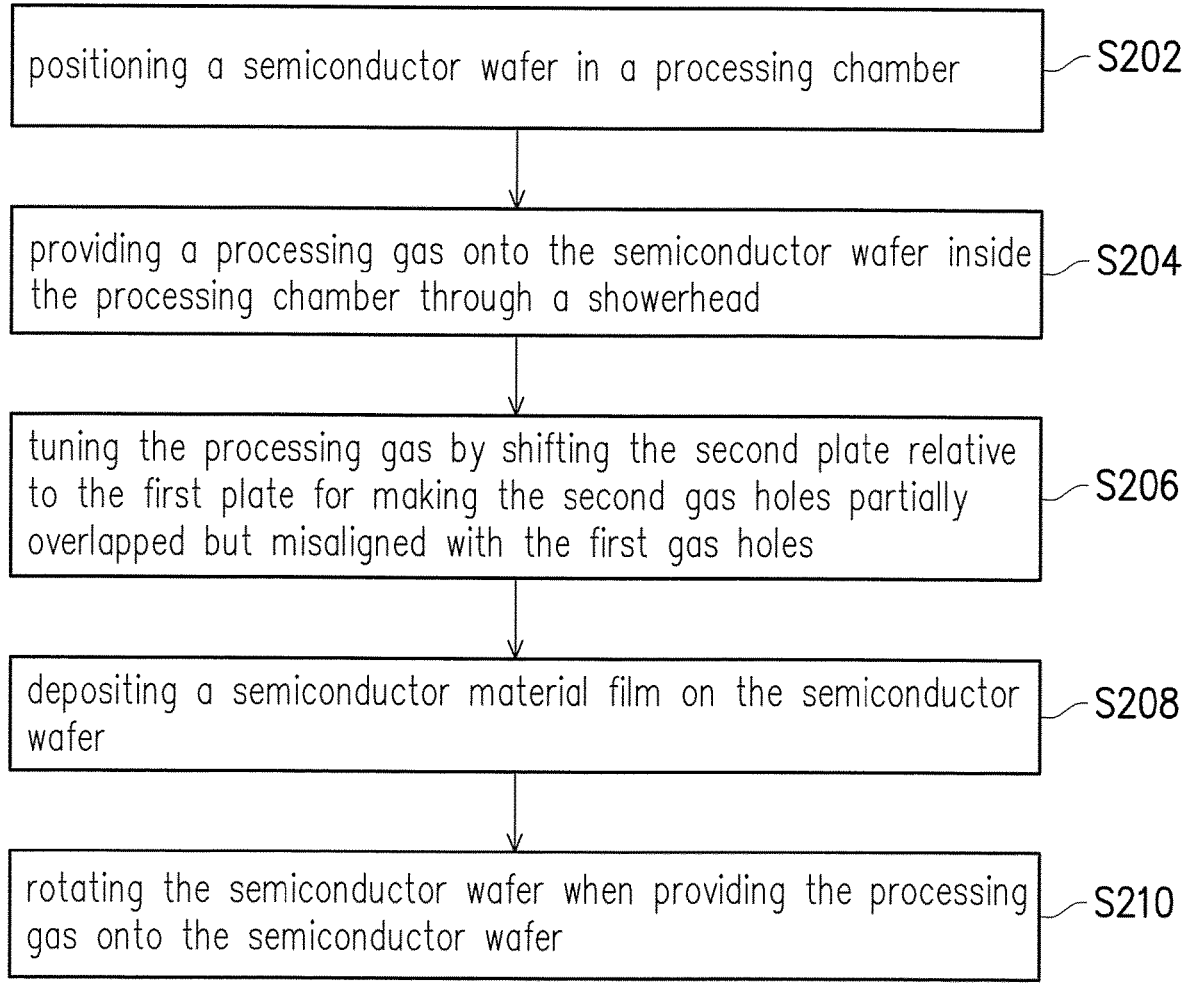
FIG. 4 is a flow chart illustrating a semiconductor process according to another embodiment of the present disclosure.

FIG. 4 is a flow chart illustrating a semiconductor process according to another embodiment of the present disclosure. The semiconductor process may be performed by the semiconductor processing apparatus 100 described in FIG. 1 and FIG. 2. The step S202, step S204, and step S206 of FIG. 4 is the same as the steps S102, S104, and S106 of FIG. 3, and the detailed description will not be repeated herein. The semiconductor process further includes depositing a semiconductor material film on the semiconductor wafer 122 (step S208). The semiconductor material film is a composition derived from that of the processing gas. The semiconductor material film is deposited by the plasma flowed from the supply plenum 132 and out of the faceplate onto the semiconductor wafer 122. The semiconductor process further includes rotating the semiconductor wafer 122 when providing the processing gas onto the semiconductor wafer 122 (step S210). That is to say the semiconductor wafer 122 is on the substrate support 120, and the substrate support 120 may be a rotating susceptor adapted to rotate. The detailed description of the rotating susceptor may be referred to in the above embodiments, and will not be repeated herein. The steps S202, S204, S206, S208, and S210 are not limited to being performed in the particular order described above. The steps S202, S204, S206, S208, and S210 may be performed in any order and some may be performed at the same time if desired or required by the user.

According to some embodiments, a showerhead is configured to be mounted on a processing chamber and provide a processing gas onto a semiconductor wafer inside the processing chamber. The showerhead includes a supply plenum, a faceplate, and an electrode plate assembly. The faceplate is disposed at a side of the supply plenum for providing the processing gas flowing from the supply plenum to the semiconductor wafer. The electrode plate assembly is disposed between a gas source and the supply plenum for providing the processing gas from the gas source to the supply plenum. The electrode plate assembly includes a first plate having a unitary construction and having a plurality of first gas holes, and a second plate having a unitary construction and having a plurality of second gas holes. The second plate is located between the first plate and the supply plenum and separated from the first plate. The plurality of second gas holes are partially overlapped but misaligned with the plurality of first gas holes.

According to some embodiments, a semiconductor processing apparatus includes a processing chamber, a substrate support, and a showerhead. The substrate support is disposed inside the processing chamber and is configured for supporting a semiconductor wafer. The showerhead is configured to be mounted on the processing chamber for providing a processing gas onto the semiconductor wafer. The showerhead includes a supply plenum, a faceplate, and an electrode plate assembly. The faceplate is disposed at a side of the supply plenum for providing the processing gas flowing from the supply plenum to the semiconductor wafer. The electrode plate assembly is disposed between a gas source and the supply plenum for providing the processing gas from the gas source to the supply plenum. The electrode plate assembly includes a first plate having a unitary construction and having a plurality of first gas holes, and a second plate having a unitary construction and having a plurality of second gas holes. The second plate is located between the first plate and the supply plenum and separated from the first plate. The plurality of second gas holes are partially overlapped but misaligned with the plurality of first gas holes.

According to some embodiments, a semiconductor process includes positioning a semiconductor wafer in a processing chamber. The semiconductor process also includes providing a processing gas onto the semiconductor wafer inside the processing chamber through a showerhead. The showerhead includes a supply plenum, a faceplate, and an electrode plate assembly. The faceplate is disposed at a side of the supply plenum for providing the processing gas flowing from the supply plenum to the semiconductor wafer. The electrode plate assembly is disposed between a gas source and the supply plenum for providing the processing gas from the gas source to the supply plenum. The electrode plate assembly includes a first plate having a unitary construction and having a plurality of first gas holes, and a second plate having a unitary construction and having a plurality of second gas holes. The second plate is located between the first plate and the supply plenum and separated from the first plate. The semiconductor process also includes tuning the processing gas by shifting the second plate relative to the first plate for making the plurality of second gas holes being partially overlapped but misaligned with the plurality of first gas holes.

The foregoing outlines features of several embodiments so that those skilled in the art may better understand the aspects of the present disclosure. Those skilled in the art should appreciate that they may readily use the present disclosure as a basis for designing or modifying other processes and structures for carrying out the same purposes and/or achieving the same advantages of the embodiments introduced herein. Those skilled in the art should also realize that such equivalent constructions do not depart from the spirit and scope of the present disclosure, and that they may make various changes, substitutions, and alterations herein without departing from the spirit and scope of the present disclosure.

What is claimed is:

1. A showerhead configured to be mounted above a processing chamber and provide a processing gas to generate a plasma flowing to a semiconductor wafer inside the processing chamber, the showerhead comprising:
   a plasma plenum, the plasma being generated in the plasma plenum;
   a faceplate disposed at a first side of the plasma plenum proximal to the semiconductor wafer for providing the plasma flowing from the plasma plenum passing through the faceplate to the semiconductor wafer;
   an electrode plate assembly disposed at a second side of the plasma plenum opposite to the first side, and disposed between a gas source and the plasma plenum for providing the processing gas from the gas source to the plasma plenum, the electrode plate assembly comprising:
      a first plate having a unitary construction and having a plurality of first gas holes, the first plate being directly connected with a radio frequency power; and
      a second plate having a unitary construction and having a plurality of second gas holes, wherein the second plate is located between the first plate and the plasma plenum and separated from the first plate, and the plurality of second gas holes are partially overlapped but misaligned with the plurality of first gas holes; and
   a gas distribution assembly disposed between the gas source and the electrode plate assembly, the gas distribution assembly comprising:
      a first gas plate with a plurality of first openings; and
      a second gas plate with a plurality of second openings, wherein the first gas plate and the second gas plate of the gas distribution manifold assembly are stacked over the first plate and the second plate of the electrode plate assembly for supplying the processing gas flowing through the gas distribution assembly to the electrode plate assembly, and a connection of the radio frequency power passes through the gas distribution assembly that is disposed between the radio frequency power and the electrode plate assembly to be connected to the first plate of the electrode plate assembly.

2. The showerhead of claim 1, further comprising:
   a gas distribution manifold assembly disposed between the gas source and the electrode plate assembly for supplying the processing gas to the plurality of first gas holes of the first plate.

3. The showerhead of claim 1, wherein the plurality of first gas holes are arranged in the same pattern as the plurality of second gas holes.

4. The showerhead of claim 3, wherein each of the plurality of first gas holes and each of the plurality of second gas holes are in the same size.

5. The showerhead of claim 1, wherein at least one of the first plate and the second plate is powered, and the faceplate is grounded to ionize the processing gas and form ionized gas plasma in the plasma plenum.

6. A semiconductor processing apparatus comprising:
   a processing chamber;
   a substrate support being configured for supporting a semiconductor wafer disposed inside the processing chamber and; and
   a showerhead configured to be mounted on the processing chamber for providing a processing gas to generate a plasma flowing to the semiconductor wafer, the showerhead comprising:
      a plasma plenum, the plasma being generated in the plasma plenum;
      a faceplate disposed at a first side of the plasma plenum proximal to the semiconductor wafer for providing the plasma flowing from the plasma plenum passing through the faceplate to the semiconductor wafer; and
      an electrode plate assembly disposed at a second side of the plasma plenum opposite to the first side, and disposed between a gas source and the plasma plenum for providing the processing gas from the gas source to the plasma plenum, the electrode plate assembly comprising:
         a first plate having a unitary construction and having a plurality of first gas holes, the first plate being directly connected with a radio frequency power; and a second plate having a unitary construction and having a plurality of second gas holes, wherein the second plate is located between the first plate and the plasma plenum and separated from the first plate, and the plurality of second gas holes are partially overlapped but misaligned with the plurality of first gas holes; and a gas distribution assembly disposed between the gas source and the electrode plate assembly, the gas distribution assembly comprising:

a first gas plate with a plurality of first openings; and a second gas plate with a plurality of second openings, wherein the first gas plate and the second gas plate of the gas distribution manifold assembly are stacked over the first plate and the second plate of the electrode plate assembly for supplying the processing gas flowing through the gas distribution assembly to the electrode plate assembly, and a connection of the radio frequency power passes through the gas distribution assembly that is disposed between the radio frequency power and the electrode plate assembly to be connected to the first plate of the electrode plate assembly.

7. The semiconductor processing apparatus of claim 6, wherein the showerhead further comprises:

a gas distribution manifold assembly disposed between the gas source and the electrode plate assembly for supplying the processing gas to the plurality of first gas holes of the first plate.

8. The semiconductor processing apparatus of claim 6, wherein the plurality of first gas holes are arranged in the same pattern as the plurality of second gas holes.

9. The semiconductor processing apparatus of claim 8, wherein each of the plurality of first gas holes and each of the plurality of second gas holes are in the same size.

10. The semiconductor processing apparatus of claim 6, wherein at least one of the first plate and the second plate is powered, and the faceplate is grounded to ionize the processing gas and form ionized gas plasma in the plasma plenum.

11. The semiconductor processing apparatus of claim 6, wherein the substrate support comprises a rotating susceptor.

12. A semiconductor process comprising:

positioning a semiconductor wafer in a processing chamber; and providing a processing gas onto the semiconductor wafer inside the processing chamber through a showerhead, the showerhead comprising:

a supply plenum;

a faceplate disposed at a side of the supply plenum for providing the processing gas flowing from the supply plenum to the semiconductor wafer; and an electrode plate assembly disposed between a gas source and the supply plenum for providing the processing gas from the gas source to the supply plenum, the electrode plate assembly comprising:

a first plate having a unitary construction and having a plurality of first gas holes, the first plate being directly connected with a radio frequency power; and a second plate having a unitary construction and having a plurality of second gas holes, the second plate being located between the first plate and the supply plenum and separated from the first plate; and a gas distribution assembly disposed between the gas source and the electrode plate assembly, the gas distribution assembly comprising:

a first gas plate with a plurality of first openings; and a second gas plate with a plurality of second openings, wherein the first gas plate and the second gas plate of the gas distribution manifold assembly are stacked over the first plate and the second plate of the electrode plate assembly for supplying the processing gas flowing through the gas distribution assembly to the electrode plate assembly, and a connection of the radio frequency power passes through the gas distribution assembly that is disposed between the radio frequency power and the electrode plate assembly to be connected to the first plate of the electrode plate assembly; and tuning the processing gas by shifting the second plate relative to the first plate for making the plurality of second gas holes partially overlapped but misaligned with the plurality of first gas holes.

13. The semiconductor process of claim 12, wherein the processing gas is provided with ionized gas plasma.

14. The semiconductor process of claim 13, further comprising depositing a semiconductor material film on the semiconductor wafer.

15. The semiconductor process of claim 13, wherein at least one of the first plate and the second plate is powered, and the faceplate is grounded to ionize the processing gas and form the ionized gas plasma in the supply plenum.

16. The semiconductor process of claim 12, further comprising rotating the semiconductor wafer when providing the processing gas onto the semiconductor wafer.

17. The showerhead of claim 1, wherein the processing gas flows through the first openings of the first gas plate and the second openings of the second gas plate of the gas distribution assembly, and the first openings of the first gas plate are misaligned with the second openings of the second gas plate.

18. The showerhead of claim 17, wherein the first gas plate and the second gas plate are vertically spaced apart from each other, and the first openings of the first gas plate and the second openings of the second gas plate are non-overlapping openings.

* * * * *